(12) United States Patent
Levesque et al.

(10) Patent No.: US 9,673,295 B2
(45) Date of Patent: Jun. 6, 2017

(54) CONTACT RESISTANCE OPTIMIZATION VIA EPI GROWTH ENGINEERING

(71) Applicant: GLOBALFOUNDRIES INC., Grand Cayman (KY)

(72) Inventors: Annie Levesque, Wappingers Falls, NY (US); Viorel C. Ontalus, Danbury, CT (US); Matthew W. Stoker, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 23 days.

(21) Appl. No.: 14/287,506

(22) Filed: May 27, 2014

(65) Prior Publication Data
US 2015/0349068 A1 Dec. 3, 2015

(51) Int. Cl.
| | |
|---|---|
| *H01L 29/66* | (2006.01) |
| *H01L 21/8238* | (2006.01) |
| *H01L 29/417* | (2006.01) |
| *H01L 29/78* | (2006.01) |
| *H01L 21/285* | (2006.01) |
| *H01L 29/165* | (2006.01) |

(52) U.S. Cl.
CPC ...... *H01L 29/665* (2013.01); *H01L 21/28518* (2013.01); *H01L 21/28525* (2013.01); *H01L 21/823814* (2013.01); *H01L 29/41783* (2013.01); *H01L 29/6656* (2013.01); *H01L 29/66628* (2013.01); *H01L 29/66636* (2013.01); *H01L 29/7848* (2013.01); *H01L 29/165* (2013.01)

(58) Field of Classification Search
CPC .......... H01L 21/823814; H01L 29/665; H01L 21/28518
See application file for complete search history.

(56) References Cited

U.S. PATENT DOCUMENTS

| | | | | |
|---|---|---|---|---|
| 6,004,857 | A * | 12/1999 | Hsiao | ...................... H01L 28/91 257/E21.013 |
| 7,960,236 | B2 | 6/2011 | Chopra et al. | |
| 8,299,535 | B2 | 10/2012 | Chan et al. | |
| 8,324,668 | B2 | 12/2012 | Huang et al. | |
| 8,338,279 | B2 | 12/2012 | Dube et al. | |
| 8,362,574 | B2 | 1/2013 | Kawasaki et al. | |
| 8,383,471 | B1 | 2/2013 | Shinihara et al. | |
| 8,383,490 | B2 * | 2/2013 | Fan | ......................... H01L 21/84 257/374 |

(Continued)

FOREIGN PATENT DOCUMENTS

CA 2322595 4/2002

*Primary Examiner* — Lex Malsawma
*Assistant Examiner* — Xia Cross
(74) *Attorney, Agent, or Firm* — Yuanmin Cai; Hoffman Warnick LLC

(57) ABSTRACT

A transistor contact structure and methods of making the same. The method includes forming a first semiconductor layer in a source/drain opening of a substrate, the first layer having a non-planar top surface; forming a second semiconductor layer directly on the first layer, the second layer having a defect density greater than the first layer; and forming a silicide region formed with the second layer, the silicide region having a non-planar interface with the first layer. A portion of the silicide interface may be higher than a top surface of the substrate and another portion may be below.

20 Claims, 5 Drawing Sheets

(56) References Cited

U.S. PATENT DOCUMENTS

| | | | |
|---|---|---|---|
| 8,399,938 B2 | 3/2013 | Cheng et al. | |
| 2006/0258091 A1* | 11/2006 | DeLoach et al. | 438/257 |
| 2012/0098042 A1* | 4/2012 | Cai | H01L 21/2257 257/288 |
| 2012/0280251 A1* | 11/2012 | Dube et al. | 257/77 |
| 2013/0146949 A1 | 6/2013 | Tsai et al. | |
| 2013/0154026 A1 | 6/2013 | Alptekin et al. | |
| 2015/0061029 A1* | 3/2015 | Sui | H01L 21/82381 257/369 |

* cited by examiner

CONTACT RESISTANCE OPTIMIZATION VIA EPI GROWTH ENGINEERING

FIELD OF THE INVENTION

The present invention relates generally to the field of integrated circuits comprising semiconductor devices and in particular relates to contact structures for semiconductor transistors and method of making the same.

BACKGROUND

In the field of integrated circuits, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. Depending on the type of conduction, a FET may be a p-type dopant doped PFET or an n-type dopant doped NFET. A FET includes a source, drain and gate region. The FET may be planar or 3D (i.e. a FinFET).

Generally, after structure of a transistor is formed, conductive contacts comprising a silicide are formed to connect to source, drain, and/or gate of the transistor to circuitry that makes the transistor fully functional. With the continuous scaling down in device dimension in integrated circuits, real estate for forming corresponding contacts is also becoming smaller and smaller.

As device dimensions scale, silicide to source-drain resistance (interface resistivity divided by contact area) increases with the inverse of the source/drain contact width. Silicide to source-drain interface resistivity is determined by the interface doping concentration, which is limited by the doping solid solubility and the barrier height, which itself is determined by the choice of the metal. Known solutions for reducing interface resistivity include using rare earth metals, which have a reduced barrier height to a specific type of carrier, and dopant segregation techniques, which "pile up" dopants at the contact interface in order to increase the electric field at the contact interface, in turn reducing the contact barrier height. Since there is an upper limit to the dopant solubility and a lower limit to the achievable contact barrier height with dopant pile-up techniques (typically zero or near zero), there necessarily exists a lower limit to the interface resistivity. In addition, as the device pitch scales down, so does the contact area, which means that the interface resistivity must scale by at least the same amount in order to preserve the same percent-wise contribution of contact resistance to the total on-state resistance. Eventually, this will no longer be possible, due to the limitations mentioned above, at which point the contact resistance is expected to dominate the FET parasitic resistance. Therefore, due to the increased role that contact resistance plays in the total on-state resistance in aggressively scaled MOSFETs there is a corresponding need to minimize it.

SUMMARY

Embodiments of the present invention provide a contact structure for a transistor. The contact structure includes a semiconductor substrate having an opening filled with a first semiconductor layer. On top of the first semiconductor layer is a silicide of a metal and a second semiconductor layer. The silicide-first semiconductor layer interface is non-planar. In some embodiments the non-planar silicide interface has a valley laterally centered on the opening. The valley may be below the top surface of the substrate. In further embodiments, the non-planar silicide interface further comprises a silicide-second semiconductor layer interface. Preferably, the first semiconductor layer comprises a source/drain region of the transistor and may be doped with a stressor such as carbon or geranium. While the second semiconductor layer may be doped with a conduction dopant, for example, phosphorus. Preferably, the non-planar interface is "U" shaped, "V" shaped or "M" shaped.

In another embodiment a method to form a contact structure includes forming a semiconductor substrate having a top surface and an opening wherein the opening has a bottom and a sidewall and wherein the top surface has a gate structure on either side of the opening and wherein each gate structure has a spacer which is adjacent the gate structure and in contact with the substrate top surface. The method further includes forming a first semiconductor layer in the opening such that the a first semiconductor layer top surface is non-planar. The method also includes forming a second semiconductor layer directly on top of the first semiconductor layer top surface and in contact with the spacer thereby forming a first semiconductor layer-second semiconductor layer interface which is non-planar. In addition, the method includes forming a silicide in at least a portion of the second semiconductor layer to form a silicide-first semiconductor interface which is non-planar.

BRIEF DESCRIPTION OF THE DRAWINGS

The present invention will be understood and appreciated more fully from the following detailed description of preferred embodiments, taken in conjunction with the accompanying drawings of which.

Figure 1:
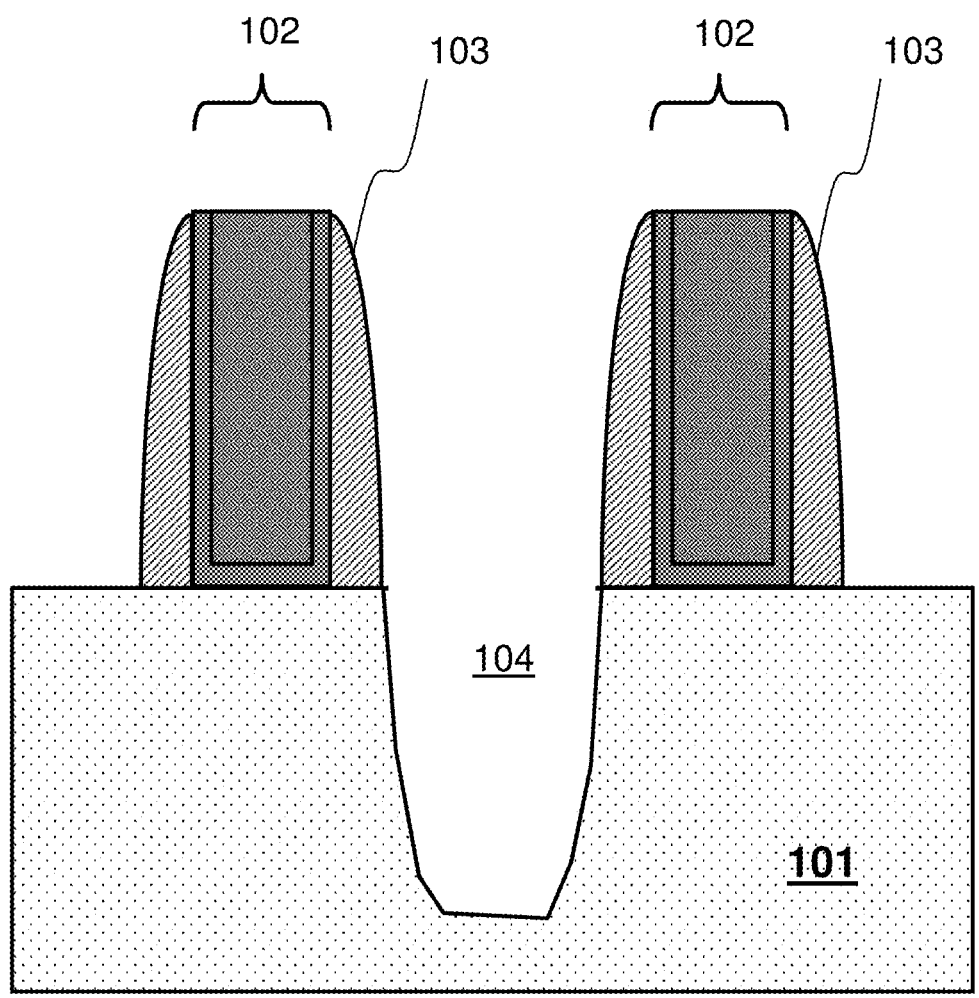
FIG. 1 is a demonstrative illustration of a possible starting point of the method of optimizing contact resistance, according to an embodiment of the invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Because lateral dimensions for contact area are limited by gate to gate pitch constraints, the invention provides a method to reduce the contact resistance of a transistor by increasing the silicide contact area in a third dimension. Specifically, the silicide contact area is increased by making the interface between the silicide and the source/drain non-linear. In such a case, the contact area is increased while within the pitch constraints thereby reducing silicide to source/drain resistance. In the invention presented here, a two-step epitaxy process controls the shape and location of the silicide (contact) interface with an embedded source/drain. The method includes forming an opening in a crystalline semiconductor substrate. The first step of the two step process forms a first semiconductor layer of a first doping largely within the substrate opening. The first semiconductor layer having a non-linear top surface including a valley and peaks. Then a second process forms a second semiconductor layer directly on the first. A non-linear interface between the first and second semiconductor layers results. The first and second semiconductor layers may have different doping composition, structural properties, and growth shapes. In a subsequent step, a metal is formed on the second semiconductor layer and heated to form a silicide. Because the first and second semiconductor layers may have different properties (for example, doping, composition, lattice mismatch and defectivity), the silicide forms in the second semiconductor layer. Thus, the contact silicide may have a non-linear interface of the original first and second semiconductor layers interface. The advantage of this approach over other known approaches is that the increased contact area (silicide to first semiconductor layer interface) offered by this approach will reduce the contact resistance without changing the dimensions of the transistor. A further advantage is that the method does not require any additional lithography, reactive ion etching or polishing steps to achieve the lower resistance, thus it is highly compatible with existing manufacturing techniques as well as being cost effective. A method of forming low resistance contact structures for transistors is illustrated in FIGS. 1-6.

FIG. 1 is a demonstrative illustration of a starting point of a method of forming contact structures for transistors according to an embodiment of the present invention. For example, one embodiment of the method may start with a substrate 101 having one or more gate structures 102, each gate structure flanked by spacers 103. An opening 104 may be formed in the substrate between the spacers 103 of adjacent gate structures 102. The opening 104 will become an embedded source/drain region of the transistor.

With reference to FIG. 1, the substrate 101 may be a semiconductor substrate. The substrate may be a bulk semiconductor substrate or a semiconductor on insulator substrate (SOI). In a preferred embodiment, the substrate comprises silicon, but other substrates containing one or more semiconducting elements are also contemplated.

With further reference to FIG. 1, the gate structure may be a high-k metal gate or a conventional silicon dioxide-poly gate. The gate structure 102 may be made by a gate first or a replacement metal gate process. The gate structure 102 may be a FinFET or a planar gate. In any case, the gate structure 102 may have one or more spacers 103 on the sidewall of the structure. Spacer(s) 103 may be a dielectric such as silicon dioxide or silicon nitride or combination thereof, for example.

With further reference to FIG. 1, the substrate openings 104 will house the future embedded source/drains. The opening has sidewalls and a bottom. As shown in FIG. 1, the sidewalls are substantially vertical, but they may also be faceted so that the opening at some point along the sidewall extends toward the gate (i.e. a "Sigma" shaped opening). The opening 104 may be from about 5 nm to about 50 nm wide and ranges therebetween. The opening 104 may be from about 5 nm to about 80 nm deep and ranges therebetween. Other dimensions and aspect ratios are contemplated. The top portions of the sidewalls of the opening 104 are preferably roughly vertically aligned with the edge of the spacer 103 where it meets the substrate 101.

Figure 2:
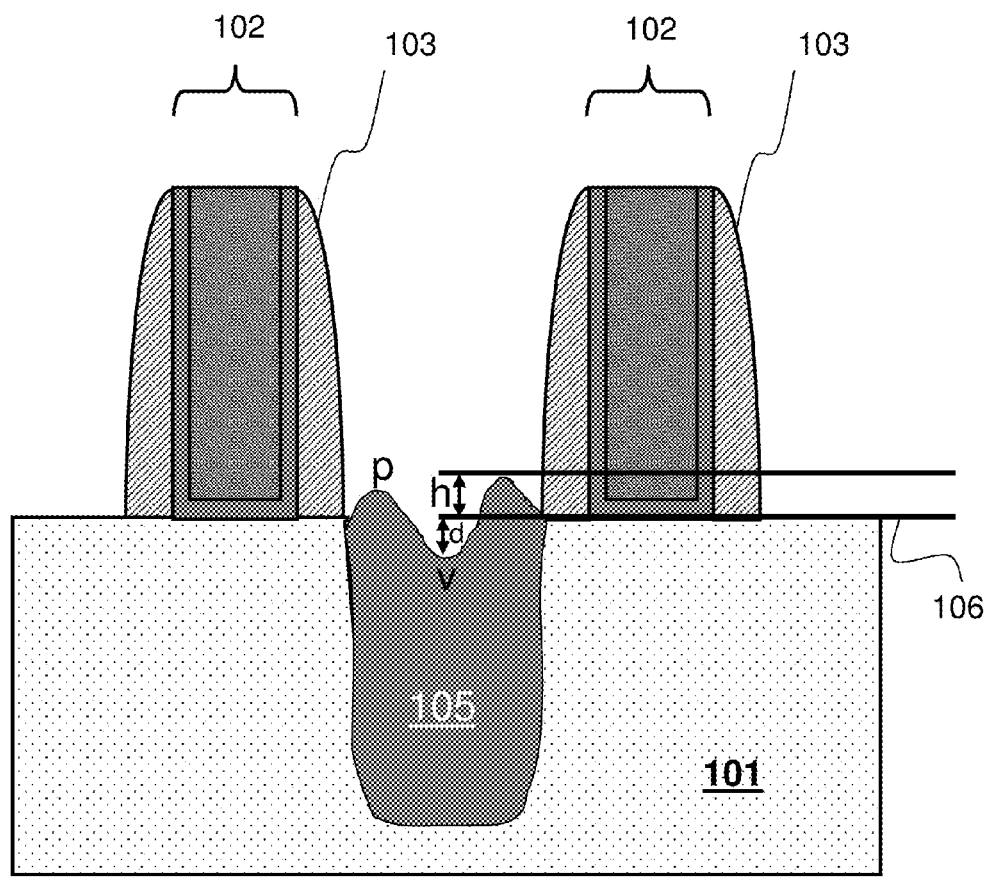
FIG. 2 is a demonstrative illustration of substrate with opening at least partially filled with a non-planar first epixial semiconductor film, according to an embodiment of the invention.

Referring to FIG. 2, following the creation of opening 104 in the substrate 101, a first semiconductor material may be epitaxially grown in the opening to form a first semiconductor layer 105. The first semiconductor layer 105 is largely inside the opening 104. The growth conditions are optimizes to achieve a non-linear top surface. Depending upon the dimensions and aspect ratio of the opening 104, the proportion of sidewall and bottom growth rate are adjusted during the deposition process. As a result, the top surface of the first semiconductor layer 105 is non-planar. In particular, the center will have a valley "v" approximately in the center of the opening. The valley may be above or below the top surface 106 of the semiconductor substrate 101. The distance ("d") of the valley relative to the top portion of the substrate may be from 10 nm to about −26 nm and ranges there between, and preferably 0 nm to about −17 nm and ranges therebetween. Note, because the valley may be above or below the semiconductor surface 106, negative valley distance numbers indicate a valley below the semiconductor surface and positive depth numbers indicate indicates the distance the valley is above the semiconductor surface 106. In addition to the valley, the non-planar top surface of the first semiconductor layer 105 may have peaks "p" flanking the valley. The peaks may extend above the top surface 106 of the substrate 101. Relative the top surface 106 of the semiconductor substrate 101, the peak may have a height from about from about 0 nm to about 15 nm and ranges therebetween. Furthermore, the distance from peak to valley in a preferred embodiment may be from about 0 nm to about 30 nm and ranges therebetween. The peak height above the substrate is critical because, as will be explained later, it plays a role in limiting the future silicide encroachment upon the channel region of the substrate. The valley depth is critical because it can be used to tune the stress imparted to the channel of a substrate. In instances when channel stress is largely determined by the first semiconductor layer, preferentially, the valley depth below the substrate should be from −3 nm to about 0 nm and ranges therebetween. In cases in which the channel stress is modulated by the silicide, then the valley depth below the substrate may be greater than about −3 nm.

Furthermore with continued reference to FIG. 2, in a preferred embodiment, the non-planar top surface of the first semiconductor layer 105 may be pinned at or near the substrate 101 surface where the substrate meets the spacer 103. As a result, the non-planar top surface of the first semiconductor layer 105 may have an "M" shape. The "M" shape is further described with continued reference to FIG. 2. Moving from left to right along the top surface of the first semiconductor layer 105, near a first spacer 103 the top surface of the first semiconductor layer 105 is approximately at the same level as the top 106 of the substrate 101, it then goes up to a first peak "p" and then goes down to the valley when approaching the center of the opening, rises to a second peak and then is pinned again at the second spacer 103/substrate top surface 101/sidewall opening junction.

As mentioned earlier, in order to achieve the non-planar profile of the top surface of the first semiconductor layer 105 process conditions are used which favor a non-linear growth front. Such deposition conditions include an etching environment. The etching environment may be by way of a cyclic process or simultaneous process which uses halogen containing precursors while minimizing non-halogen containing silanes. In a cyclic process, the deposition may be in a low to medium vacuum regime and the etch in a medium vacuum regime as defined by as defined by John O'Hanlon's *A User's Guide to Vacuum Technology*, 3$^{rd}$ edition, 2003, p. 4, incorporated herein by reference. To promote pinning at the junction of the spacer 103, sidewall opening and top surface 106 of substrate, precursors diluted with inert carrier gases in a lower pressure environment may be employed.

The composition of the first semiconductor layer 105 may include, as non-limiting examples, silicon-based material, germanium-based material, and/or III-V semiconductor material. Preferably the first semiconductor layer 105 is doped with at least a first dopant(s). The dopant(s) may be an electrical conduction inducing dopants or stress inducing dopants. A non-exhaustive list of conduction dopants includes P, As, Sb, Bi and B, for example. A non-exhaustive list of stress dopants includes C, Sn, and Ge, for example. In a preferred embodiment of an NFET, the first semiconductor layer includes a stress inducing dopant (C) and an electrical conduction inducing dopant (P). When the first semiconductor layer 105 includes stress inducing dopants, stress transferred to the channel can also be manipulated by adjusting the distance the valley is relative to the top surface 106 of the substrate 101.

Figure 3:
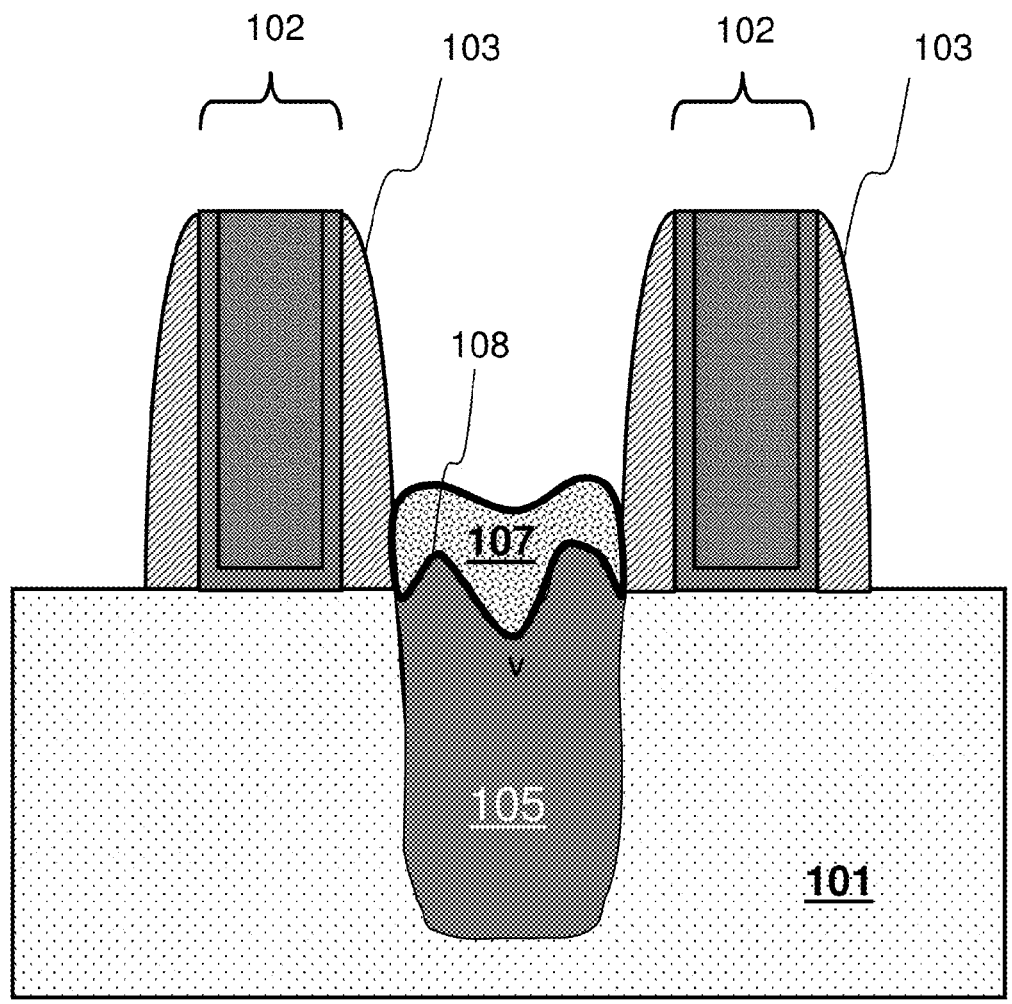
FIG. 3 is a demonstrative illustration of second epixial semiconductor film formed on the first, according to an embodiment of the invention.

Referring to FIG. 3, a second semiconductor layer 107 is formed on the first semiconductor layer 105. In a preferred embodiment second semiconductor layer 107 is epitaxially grown directly on the first semiconductor layer 105. Here, the second layer 107 may grow conformally along the top surface of the first layer 105 such that the interface 108 between the first 105 and second 107 semiconductor layers has the same non-planarity as the top surface of the first layer 107 as described in conjunction with FIG. 2. In addition, the second layer 107 will also grow along sidewalls of the spacers 103. Because the second layer 107 grows along two different interfaces having different surface structure, namely the interface with the first layer 105 which has a crystalline or polycrystalline surface and the interface with the sidewall 103 which has an amorphous surface, the second semiconductor layer 107 will have more defects relative to the first semiconductor layer 105. Likewise, the second layer 107 may have a different lattice mismatch compared to the first when the layers have different compositions, for example, different dopants.

In order to achieve growth on an amorphous surface, the process for forming the second layer 107 usually occurs at a much higher press than the first layer process. For example, the pressure may be in the low vacuum range (and ranges therebetween) as defined by John O'Hanlon's *A User's Guide to Vacuum Technology*, 3$^{rd}$ edition, 2003, p. 4, incorporated herein by reference. Process conditions may also be used to manipulate the defect level of the second layer 107. Generally, process conditions which increase the deposition rate will increase the defect level. Such process conditions include increased temperature, pressures and dopant concentration.

Turning to the dopants in the second layer 107, the dopants in terms of identity may be the same as described in conjunction with the first layer 105. However, in a preferred embodiment, the second layer 107 dopants differ from the first layer 105 dopants both in identity and doping level. For example, the first layer dopants may have stressor dopant that the second layer lacks while conductivity dopants, if any, may be the same or different. In a preferred embodiment of an NFET, the second layer may be silicon doped with phosphorus.

Figure 4:
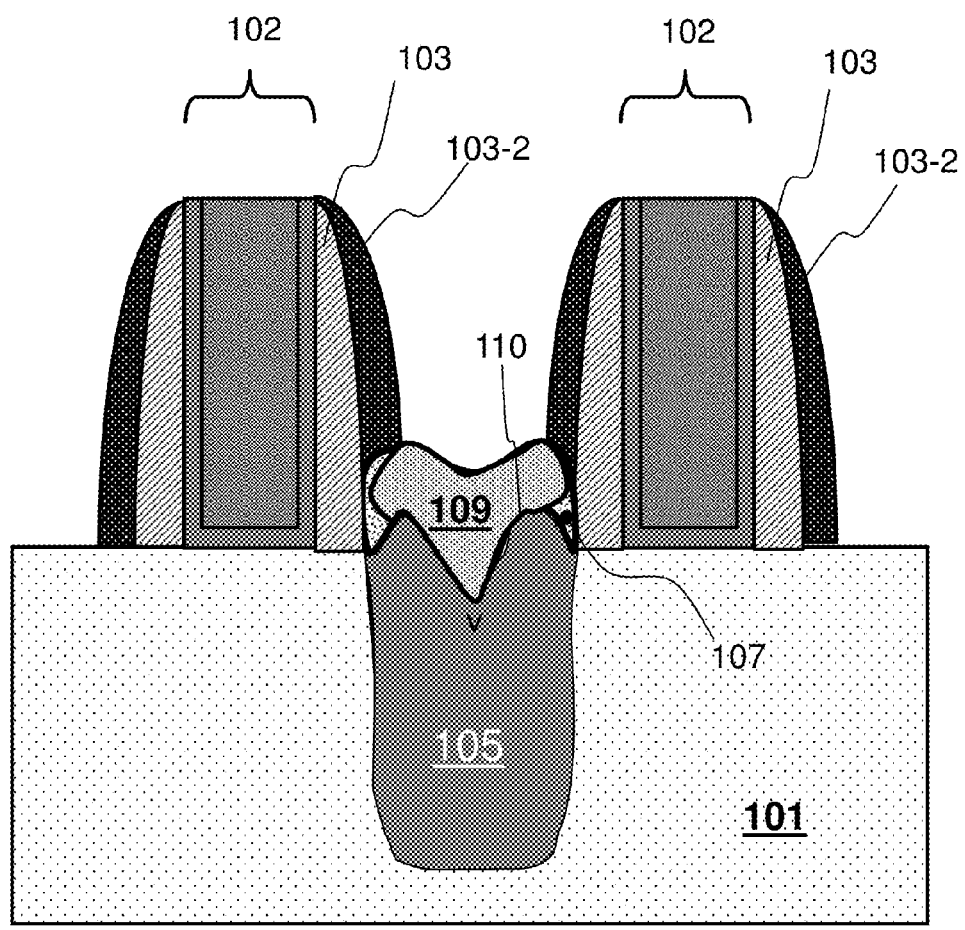
FIG. 4 is a demonstrative illustration of silicide layer having a non-planar interface with the source drain region, according to an embodiment of the invention.

Continuing with FIG. 3 and transitioning to FIG. 4, following the formation of the first and second layers (105 and 107, respectively), a silicide 109 may be formed, Prior to forming a silicide a second spacer 103-2 may be formed on the pre-existing spacer 103. The second spacer 103-2 may land on a portion of the peak on the top of the second layer 107. Forming a second spacer 103-2 aids in preventing the to-be formed silicide from encroaching on the channel region of the substrate 101. To form the silicide, a metal may be deposited on top of a portion or the entire structure. The substrate is annealed to react the metal with the second layer 107 to form a silicide 109 (See FIG. 4). Unreacted portions of the metal are then removed. The metal may be Ni, Co, Cr, Ru, Ti, Fe but other materials can also be contemplated. Here, because the second layer 107 is more defective and/or has different doping and/or different lattice constant than the first layer 105, the metal will diffuse through the second layer 107 faster than the first 105. That means under the proper temperature and duration conditions, the silicide 109 will form in all or part of the second layer 107 but not the first. Thus the silicide interface 110 will follow at least a portion of the original first and second layer interface 108 of FIG. 3. For example, referring to FIG. 4, silicide 109 is formed in a portion of second layer 107 such that the silicide 109 has an interface 110 with the first layer 105 which is non-planar, and specifically here, "U" or "V" shaped. The "U" follows at least a portion of the same interface of the original first/second layer interface 108. Still referring to FIG. 4, the silicide formation conditions were such that the silicide did not form in all areas for second layer 107, however, the conditions could be adjusted so that the entire second layer 107 was converted to silicide 109 (in which case an "M" shaped silicide interface 110 is expected). The anneal time and temperature conditions may also be that the silicide does form in a portion of the first layer 105; however, because the silicide formation is much slower in the first layer 105 (due to the different defect, doping, and etc. of the two layers) as compared to the second layer, the silicide interface will maintain a U or V shape.

There are several advantages of the silicide configuration as depicted in FIG. 4, for instance, the silicide 109 is some distance away from the substrate 101 top surface 106, or stated another way the silicide 109 does not encroach upon the substrate 101. This lack of encroachment is achieved in part by the peak created in the first layer 105 (and specifically it's height above the substrate surface), the second spacer 103-2, and the differential metal diffusion rate in the first and second layers 105 and 107. The intervening distance may be occupied one or both of the first and second layers (105 and 107, respectively). Another advantage of the silicide of the present invention is that the non-planar silicide interface 110 increases the interface area as compared to a conventional planar interface in the same width. Thus, the increased interface area helps to reduce the total silicide resistance between the silicide 109 and the source/drain region (here, first layer 105).

Figure 5:
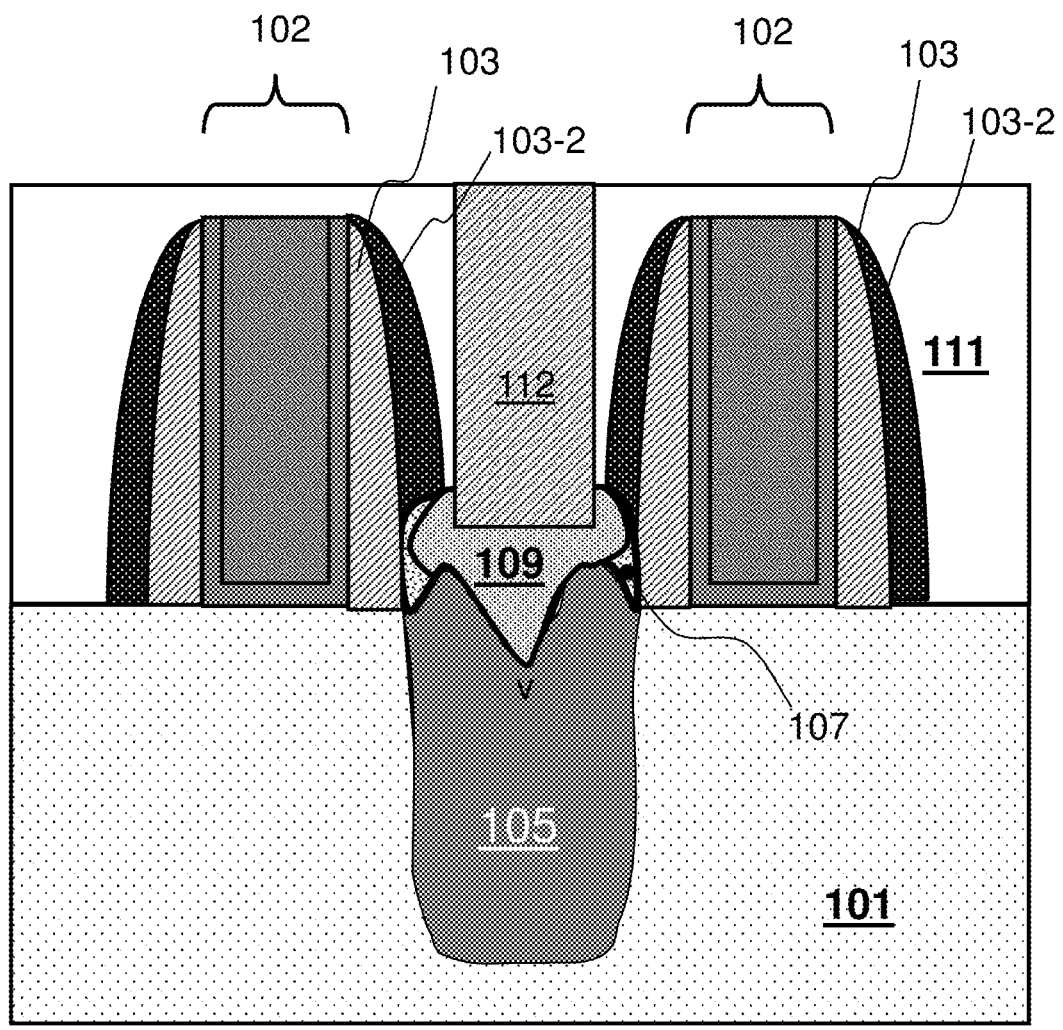
FIG. 5 is a demonstrative illustration of silicide layer having a non-planar interface with the source drain region and a contact stud, according to an embodiment of the invention.

Referring to FIG. 5, the contact structure is shown in a later step in processing in which a dielectric layer 111 covers the substrate and gate structures and a stud 112 is formed in the dielectric layer 111 to make direct physical and electrical contact with the silicide which in turn makes electrical contact with the source/drain (here, including first layer 105). The dielectric may be a doped oxide such as BPSG or PSG or other dielectrics. The dielectric layer 111 may includes several layers of different dielectrics. The stud is filled with conductive material, a typical but non-limiting example of a stud 112 may be tungsten lined with Ti/TiN.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming a semiconductor substrate having a top surface and an opening wherein the opening has a bottom and a sidewall and wherein the top surface has a gate structure on either side of the opening and wherein each gate structure has a spacer which is adjacent and directly contacts the gate structure and wherein the spacer is positioned on the substrate top surface;
    forming a first semiconductor layer in the opening such that the first semiconductor layer top surface is non-planar and includes:
        a first valley positioned below the top surface of the substrate; and
        a first peak laterally adjacent to the valley and positioned above the top surface of the substrate;
    forming a second semiconductor layer on top of the first semiconductor layer top surface and in direct contact with the spacer; and
    forming a silicide by reacting with a portion of the second semiconductor layer in a remaining portion of the second semiconductor layer to form a silicide-first semiconductor interface which includes a second valley positioned above the first valley, wherein after forming the silicide, both the silicide and the remaining portion of the second semiconductor layer directly contact the first semiconductor layer, and all the silicide is separated from the semiconductor substrate by at least one of the first semiconductor layer and the remaining portion of the second semiconductor layer.

2. The method of claim 1, wherein the first semiconductor layer comprises a dopant which imparts a stress to a channel region of a transistor.

3. The method of claim 2, wherein the second semiconductor film comprises a second dopant wherein the second dopant is different from the dopant which imparts the stress to the channel region.

4. The method of claim 1, wherein the first valley is centered laterally with respect to the opening.

5. The method of claim 1, wherein the second semiconductor layer has a higher defect density than the first semiconductor layer.

6. The method of claim 5 wherein forming the silicide occurs preferentially in the second semiconductor layer.

7. The method of claim 1, wherein the first semiconductor layer top surface is "M" shaped.

8. The method of claim 7 wherein forming the first semiconductor layer occurs by using a deposition process and an etching process.

9. The method of claim 8 wherein the deposition process and the etching process are selected from a group consisting of cyclic and simultaneous.

10. The method of claim 1, further comprising forming a pair of additional spacers on the second semiconductor layer, such that each of the pair of additional spacers contacts the spacer of the gate structure on a respective sidewall of the opening, after forming the second semiconductor layer.

11. The method of claim 10, wherein the second semiconductor layer and the silicide are positioned vertically between the first semiconductor layer and the pair of additional spacers.

12. A method comprising:
    forming a semiconductor substrate having a top surface and an opening wherein the opening has a bottom and a sidewall and wherein the top surface has a gate structure on either side of the opening and wherein each gate structure has a spacer which is adjacent and directly contacts the gate structure and wherein the spacer is in contact with the substrate top surface;
    forming a first semiconductor layer in the opening such that the first semiconductor layer top surface is non-planar and includes: a first laterally-centered valley positioned below the top surface of the substrate, and a pair of first peaks each laterally adjacent to the valley and positioned above the top surface of the substrate;
    growing a second semiconductor layer directly on top of the first semiconductor layer top surface and in direct contact with the spacer thereby forming a first semiconductor layer-second semiconductor layer interface which is non-planar and includes a second valley positioned above the first valley and a pair of second peaks each positioned above one of the pair of first peaks; and
    forming a silicide by reacting with a portion of the second semiconductor layer in a remaining portion of the second semiconductor layer to form a silicide-first semiconductor interface from the first semiconductor layer-second semiconductor layer interface which includes the second valley and the pair of second peaks, wherein after forming the silicide, both the silicide and the remaining portion of the second semiconductor layer directly contact the first semiconductor layer, and all the silicide is separated from the semiconductor substrate by at least one of the first semiconductor layer and the remaining portion of the second semiconductor layer.

13. The method of claim 12, wherein the first semiconductor layer includes a stress-inducing dopant for a channel region of a transistor, and wherein the forming of the silicide-first semiconductor interface with the second valley causes the stress-inducing dopant to migrate from the first semiconductor layer to a channel region of a transistor.

14. The method of claim 12, wherein each of the first valley and the second valley are one of U-shaped, V-shaped, or M-shaped.

15. The method of claim 12, wherein a height of the pair of first peaks above the top surface of the substrate prevents encroachment of the formed silicide into the semiconductor substrate.

16. The method of claim 12, further comprising forming a pair of additional spacers on the second semiconductor layer, such that each of the pair of additional spacers contacts the spacer of the gate structure on a respective sidewall of the opening, after forming the second semiconductor layer.

17. A method comprising:
   forming a semiconductor substrate having a top surface and an opening wherein the opening has a bottom and a sidewall and wherein the top surface has a gate structure on either side of the opening and wherein each gate structure has a spacer which is adjacent and directly contacts the gate structure and wherein the spacer is positioned on the substrate top surface;
   forming a first semiconductor layer in the opening such that the first semiconductor layer top surface is non-planar and includes: a first laterally-centered valley positioned below the top surface of the substrate, and a first peak laterally adjacent to the first laterally-centered valley and positioned above the top surface of the substrate, wherein a distance between a top surface of the first peak and a bottom surface of the first laterally-centered valley is at most approximately thirty nanometers;
   forming a second semiconductor layer on top of the first semiconductor layer top surface and in direct contact with the spacer, wherein a top surface of the second semiconductor layer includes a second laterally-centered valley and a second peak;
   forming a pair of additional spacers on the second semiconductor layer, such that each of the pair of additional spacers contacts the spacer of the gate structure on a respective sidewall of the opening, after forming the second semiconductor layer; and
   forming a silicide by reacting with a portion of the second semiconductor layer in a remaining portion of the second semiconductor layer to form a silicide-first semiconductor interface which includes the second laterally-centered valley and the second peak, wherein after forming the silicide, both the silicide and the remaining portion of the second semiconductor layer directly contact the first semiconductor layer, and all the silicide is separated from the semiconductor substrate by at least one of the first semiconductor layer and the remaining portion of the second semiconductor layer.

18. The method of claim 17, wherein each of the first valley and the second valley are one of U-shaped, V-shaped, or M-shaped.

19. The method of claim 17, wherein the first peak extends above the top surface of the substrate at a height which prevents encroachment of the formed silicide into the semiconductor substrate.

20. The method of claim 17, wherein the first semiconductor layer comprises a dopant which imparts a stress to a channel region of a transistor.

* * * * *